United States Patent
Jen et al.

(10) Patent No.: US 9,455,116 B2
(45) Date of Patent: Sep. 27, 2016

(54) ANGULAR SCANNING USING ANGULAR ENERGY FILTER

(71) Applicant: Axcelis Technologies, Inc., Beverly, MA (US)

(72) Inventors: Causon Ko-Chuan Jen, San Jose, CA (US); William Bintz, Londonderry, NH (US)

(73) Assignee: Axcells Technologies, Inc., Beverly, MA (US)

( * ) Notice: Subject to any disclaimer, the term of this patent is extended or adjusted under 35 U.S.C. 154(b) by 0 days.

(21) Appl. No.: 14/692,395

(22) Filed: Apr. 21, 2015

(65) Prior Publication Data

US 2015/0318142 A1    Nov. 5, 2015

Related U.S. Application Data

(60) Provisional application No. 61/986,350, filed on Apr. 30, 2014.

(51) Int. Cl.
| | |
|---|---|
| *H01J 37/00* | (2006.01) |
| *H01J 37/147* | (2006.01) |
| *H01J 37/20* | (2006.01) |
| *H01J 37/317* | (2006.01) |

(52) U.S. Cl.
CPC ........ *H01J 37/1474* (2013.01); *H01J 37/1478* (2013.01); *H01J 37/20* (2013.01); *H01J 37/3171* (2013.01); *H01J 2237/08* (2013.01); *H01J 2237/151* (2013.01); *H01J 2237/152* (2013.01); *H01J 2237/1506* (2013.01); *H01J 2237/20207* (2013.01); *H01J 2237/20214* (2013.01);

(Continued)

(58) Field of Classification Search
CPC .. H01J 37/1474; H01J 37/3171; H01J 37/20; H01J 2237/152; H01J 2237/151; H01J 2237/31701; H01J 2237/08
USPC ................. 250/396 R, 396 ML, 492.1–492.3
See application file for complete search history.

(56) References Cited

U.S. PATENT DOCUMENTS

| | | |
|---|---|---|
| 6,777,696 B1 | 8/2004 | Rathmell et al. |
| 6,881,966 B2 | 4/2005 | Benveniste et al. |

(Continued)

OTHER PUBLICATIONS

Godet, et al. "Improved Sidewall Doping of Extensions by AsH3, Ion Assisted Deposition and Doping (IADD) with Small Implant Angle for Scaled NMOS Si Bulk FinFETs.", IEEE, 2013, 20.6.1-20.6.4.

*Primary Examiner* — Michael Maskell
(74) *Attorney, Agent, or Firm* — Eschweiler & Associates, LLC

(57) ABSTRACT

An ion implantation system and method is provided for varying an angle of incidence of a scanned ion beam relative to the workpiece concurrent with the scanned ion beam impacting the workpiece. The system has an ion source configured to form an ion beam and a mass analyzer configured to mass analyze the ion beam. An ion beam scanner is configured to scan the ion beam in a first direction, therein defining a scanned ion beam. A workpiece support is configured to support a workpiece thereon, and an angular implant apparatus is configured to vary an angle of incidence of the scanned ion beam relative to the workpiece. The angular implant apparatus comprises one or more of an angular energy filter and a mechanical apparatus operably coupled to the workpiece support, wherein a controller controls the angular implant apparatus, thus varying the angle of incidence of the scanned ion beam relative to the workpiece concurrent with the scanned ion beam impacting the workpiece.

17 Claims, 6 Drawing Sheets

(52) U.S. Cl.
CPC ............... *H01J2237/31701* (2013.01); *H01J 2237/31708* (2013.01)

(56) References Cited

U.S. PATENT DOCUMENTS

| | | | |
|---|---|---|---|
| 7,361,914 B2* | 4/2008 | Rathmell | H01J 37/244 250/397 |
| 2003/0094583 A1* | 5/2003 | Jang | H01J 37/3171 250/492.21 |
| 2003/0197132 A1* | 10/2003 | Keum | H01J 37/3045 250/492.21 |
| 2006/0113493 A1* | 6/2006 | Kabasawa | H01J 27/024 250/492.21 |
| 2010/0065761 A1 | 3/2010 | Graf et al. | |
| 2011/0297842 A1* | 12/2011 | Ninomiya | H01J 37/304 250/396 ML |

\* cited by examiner

ANGULAR SCANNING USING ANGULAR ENERGY FILTER

REFERENCE TO RELATED APPLICATIONS

This application claims the benefit of U.S. Provisional Application No. 61/986,350 filed Apr. 30, 2014, entitled "ANGULAR SCANNING USING ANGULAR ENERGY FILTER", the contents of which are herein incorporated by reference in their entirety.

FIELD

The present disclosure relates generally to ion implantation systems and methods for implanting ions into a workpiece, and more specifically to a system and method for concurrent scanning an ion beam in a first direction relative to the workpiece and selectively varying an angle of the scanned ion beam relative to the workpiece in a second direction.

BACKGROUND

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a workpiece in order to implant the workpiece with the dopant element. The ions of the ion beam penetrate the surface of the workpiece to form a region of desired conductivity, such as desired in the fabrication of transistor devices in a semiconductor wafer. A typical ion implanter includes an ion source for generating the ion beam, a beamline assembly including a mass analysis apparatus for mass resolving the ion beam using magnetic fields, and a target chamber containing the workpiece to be implanted by the ion beam.

In ion implantation processes, the angle at which the ion beam approaches the workpiece (also called an implant angle) is fixed at a particular angle during the ion implantation. It is becoming common, however, for devices being formed on a workpiece 10, such as illustrated in FIG. 1, to have three-dimensional (3-D) structures 12, wherein uniform ion implantation across all dimensional surfaces of the 3-D structure is desired. For example, in a FinFET device 14, variations of the incident angle of an ion beam 16 to the workpiece 10 is desirable in order to implant both trenches 18 and sidewalls 20 of structures 22 of the FinFET device.

Conventionally, in order to implant ions into the workpiece 10 at different incident angles, the ion implantation is temporarily halted or idled (with the ion beam 16 not being directed toward the workpiece), and the workpiece is mechanically tilted (e.g., illustrated by arrow 24) relative to the ion beam 16, thus varying or modifying the angle of incidence of the ion beam to the workpiece. The ion beam 16 is then again directed toward the workpiece 10 and the workpiece is implanted at the modified angle of incidence. In FinFET devices, where complex 3-D structures can be present, this may require two or more different incident angle variations in order to adequately implant the trenches 18 and/or sidewalls 20 of the structures 22. Heretofore, systems and methods for achieving angle variation have been to pivot the workpiece 10 around an axis such that the ion beam 16 strikes the workpiece at a different angle.

As such, since the angle of incidence is mechanically varied at the workpiece 10, throughput associated with the operation of the ion implantation system can be adversely affected, as substantial time can be spent with the ion beam not impacting the workpiece while the angle of incidence is mechanically varied.

SUMMARY

The present disclosure presents a novel approach to providing a selectively variable angle of incidence of an ion beam to a workpiece, whereby the angle at which the ion beam travels is varied so as to strike the workpiece at the selected angle. The present disclosure thus provides a system, apparatus, and method for implanting ions into workpieces while maximizing throughput and minimizing costs of ownership associated with the systems. More particularly, the present disclosure provides a continuously variable implant angle, having a small angle range, concurrent with workpiece scanning during ion implantation. Accordingly, a final dopant profile can be made more uniform for a three-dimensional trench-like structure, as opposed to conventional methods using multiple discrete angle implant steps.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation system, wherein the ion implantation system comprises an ion source configured to form an ion beam and a mass analyzer configured to mass analyze the ion beam. An ion beam scanner is configured to scan the ion beam in a first direction, therein defining a scanned ion beam, and a workpiece support is configured to support a workpiece thereon. An angular implant apparatus is further provided, wherein the angular implant apparatus is configured to vary an angle of incidence of the scanned ion beam relative to the workpiece, and a controller is configured to control the angular implant apparatus. The controller is configured to vary the angle of incidence of the scanned ion beam relative to the workpiece concurrent with the scanned ion beam impacting the workpiece. Further, in another example, the angle of incidence is varied concurrent with mechanical scanning the workpiece residing on a workpiece support.

In accordance with one exemplary aspect, the angular implant apparatus comprises an angular energy filter positioned downstream of the ion beam scanner. The controller is thus configured to vary an input to the angular energy filter, therein varying the angle of incidence of the scanned ion beam relative to the workpiece concurrent with the scanned ion beam impacting the workpiece. In one example, the angular energy filter comprises one or more of a magnetic deflection module and an electrostatic deflection module.

In another example, the angular implant apparatus comprises a mechanical apparatus operably coupled to the workpiece support, wherein the mechanical apparatus is configured to further vary the angle of incidence of the scanned ion beam relative to the workpiece. The controller is further configured to control the mechanical apparatus concurrent with the scanned ion beam impacting the workpiece. In accordance with another exemplary aspect, the angular implant apparatus comprises both the angular energy filter and the mechanical apparatus operably coupled to the workpiece support.

According to yet another aspect, a method for implanting ions into a workpiece at one or more incident angles is provided. The method comprises providing a workpiece on a workpiece support and scanning an ion beam relative to the workpiece. Further, according to the method, an angle of incidence of the scanned ion beam relative to the workpiece is varied concurrent with the scanned ion beam impacting the workpiece. The angle of incidence of the scanned ion beam relative to the workpiece, for example, is varied by varying an input to one or more of an angular energy filter and mechanically varying an angle of the workpiece support with respect to the scanned ion beam. As such, the angle of incidence of the scanned ion beam relative to the workpiece is varied concurrent with the scanned ion beam impacting the workpiece.

The above summary is intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
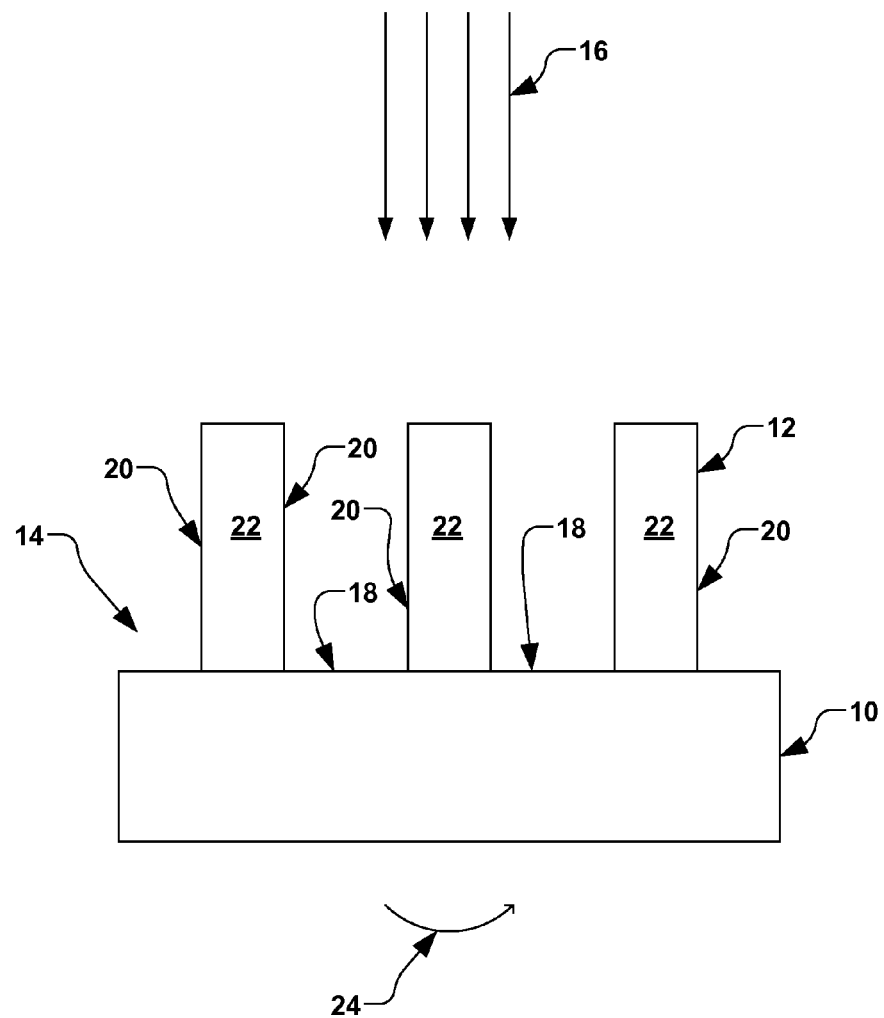
FIG. 1 illustrates an exemplary three-dimensional workpiece in accordance with various aspects of the present disclosure.

The present disclosure relates generally to ion implantation systems and methods for implanting ions into a workpiece, and more specifically to a system and method for concurrently scanning an ion beam in a first direction relative to the workpiece and selectively varying an angle of the scanned ion beam relative to the workpiece in a second direction. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessary to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 2:
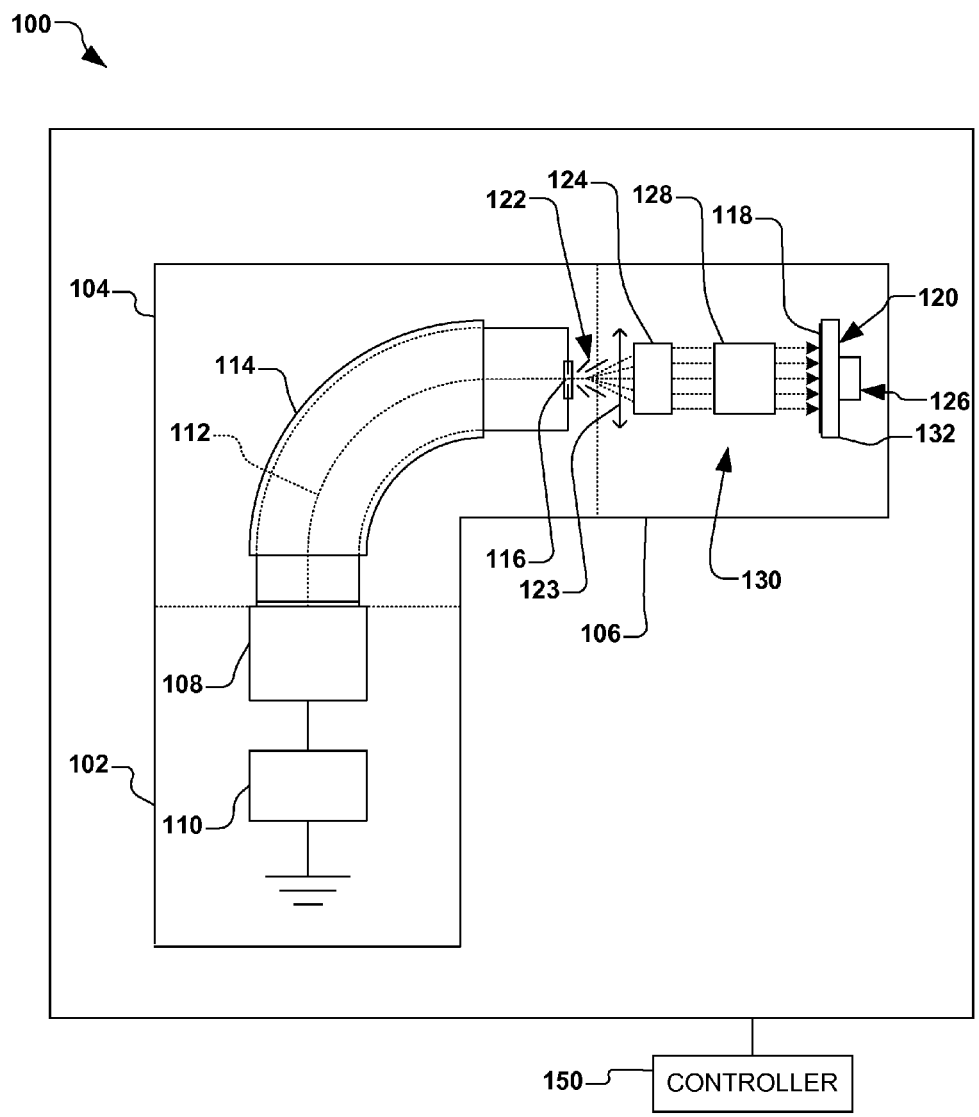
FIG. 2 illustrates a block diagram schematic of an exemplary ion implantation system in accordance with various aspects of the present disclosure.

Referring now to the figures, in accordance with one aspect of the present disclosure, FIG. 2 illustrates an exemplary ion implantation system 100. The ion implantation system 100, for example, comprises a terminal 102, a beamline assembly 104, and an end station 106. Generally speaking, an ion source 108 in the terminal 102 is coupled to a power supply 110 to ionize a dopant gas into a plurality of ions and to form an ion beam 112. The ion beam 112 in the present example is directed through a mass analyzer 114, and out an aperture 116 towards the end station 106. In the end station 106, the ion beam 112 impacts a workpiece 118 (e.g., a semiconductor workpiece such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. In a preferred embodiment, the ion beam 112 comprises a spot beam, wherein the spot beam is scanned via a beam scanner 122 positioned downstream of the aperture 116. The beam scanner 122, for example, electrostatically or magnetically scans the ion beam 112 along a first axis 123 (e.g., in the x-direction), wherein a plurality of beamlets of the ion beam can be further parallelized downstream of the beam scanner via a parallelizer 124. Furthermore, a workpiece scanner 126 can be utilized to scan the workpiece through the scanned ion beam 112 (e.g., the workpiece 118 is mechanically scanned in the y-direction).

Figure 3:
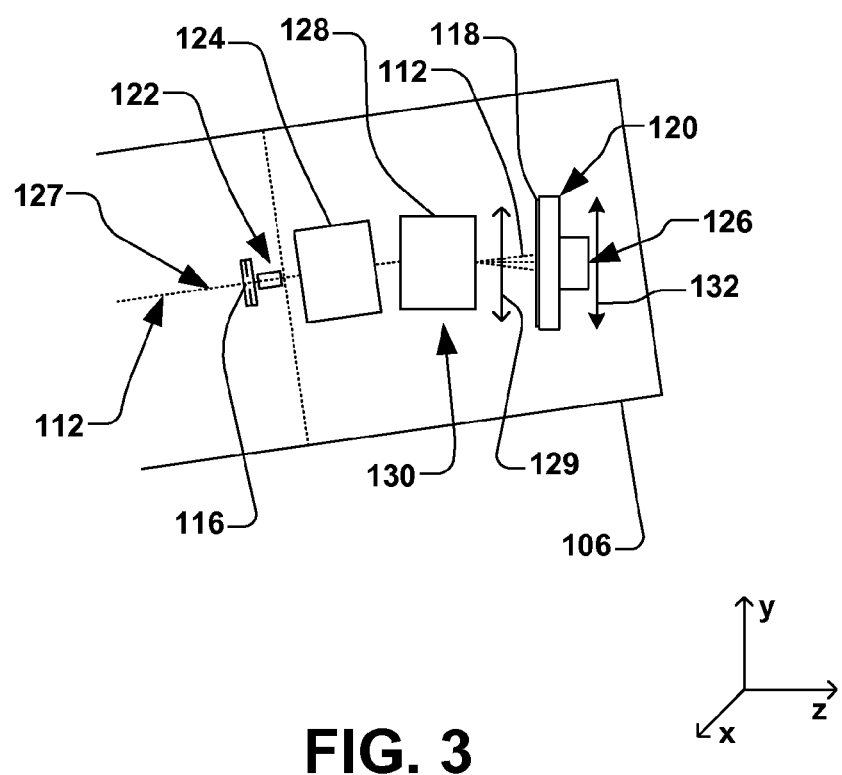
FIG. 3 illustrates another view of a portion of the block diagram schematic of FIG. 2 in accordance with various aspects of the disclosure.

The present disclosure further implements an angular energy filter (AEF) 128 that is provided in the ion implantation system 100. For example, the AEF 128 can comprise one or more features provided in the Purion Ion Implantation System manufactured by Axcelis Technologies, Inc. of Beverly, Mass. The AEF 128, for example, is configured to receive the scanned and parallel ion beam 112 and subsequently deflect the ion beam from an incoming beamline axis 127 along a second axis 129 (e.g., in the vertical or y-direction), as illustrated in FIG. 3, toward the workpiece 118 in order to prevent neutral particles from reaching the workpiece. For example, U.S. Pat. No. 6,881,966 to Benveniste et al., which is incorporated by reference in its entirety herein, discloses a magnetic deflector employed in conjunction with an electrostatic deflector to form a hybrid deflection system. In the hybrid deflection system, a magnetic deflector module is employed for deflection at generally low ion beam energies, while an electrostatic deflection module is employed at generally higher beam energies. The AEF 128, for example, may be controlled to vary the trajectory of the ion beam 112 as a function of the energy thereof, and to deflect desired ions to be implanted from neutral ions traveling along the path of travel of the beam. Additional disclosures of AEF systems, for example, can be found in U.S. Pat. No. 6,777,696 to Rathmell et al., and U.S. Patent Publication No. 2010/0065761 to Graf et al., and are also incorporated by reference herein in their entireties.

The present disclosure utilizes the AEF 128 to vary the trajectory of the ion beam 112 to be implanted such that the angle of implantation can be varied concurrent with implantation by adjusting the angle of attack of the ion beam toward the workpiece 118, as opposed to mechanically adjusting the angle at which the workpiece is positioned in front of the ion beam. For example, conventionally, vertical beam adjustment in an ion implantation system is provided via a system for determining a relative orientation between an ion beam and a workpiece. A measurement component allows for relative orientation between the measurement component and the workpiece at a selective relationship relative to the ion beam so that a relative orientation between the workpiece and beam can be mechanically adjusted or established. For example, U.S. Pat. No. 7,361,914 to Rathmell et al. provides an exemplary measurement component for determining the relative orientation between an ion beam and a workpiece.

Rather than providing the above-described mechanical adjustments of workpiece orientation at the workpiece support 120, the present disclosure advantageously utilizes electronic and/or magnetic adjustments of beam trajectory via beam deflection as provided by the AEF 128 in order to provide variable angles of ion implantation concurrent with the implantation. It is presently appreciated that mechanical variation of the tilt angle via the workpiece support 120 provides a frequency of variation of tilt angle that is significantly slower than angle variation via the AEF 128 of the present disclosure. For example, conventional tilt angles are varied at approximately 2-3 Hz using mechanical variation of the workpiece support 120, while the angle variation of the present disclosure utilizing the AEF 128 or other beam scanning apparatus is capable of angle variation of one to several orders of magnitude greater than conventional mechanical systems.

It will be understood that the present disclosure may also be used to supplement the mechanical workpiece adjustment described above, such that the mechanical workpiece adjustment at the workpiece support 120 can provide rough angle adjustment or rotation, while the electrical or magnetic deflection of the ion 112 beam via the AEF 128 provides more accurate final angle adjustment for precise angular orientation between the ion beam 112 and the workpiece 118. Accordingly, an angular implant apparatus 130 can be considered to comprise one or more of the AEF 128 and the adjustable workpiece support 120, wherein the angular implant apparatus is configured to vary an angle of incidence of the scanned ion beam 112 relative to the workpiece 118. Further, it should be noted that the present invention is applicable to both pencil/spot ion beam and ribbon beam implantation systems.

It is also presently appreciated that the faster scanning angle change provided in the present disclosure may be used to decouple the workpiece scan (e.g., associated with the workpiece scanner 126) from the workpiece tilt angle, as well as vibration associated with the mechanical workpiece adjustment. The AEF 128, for example, can be an electrical or magnetic energy filter, wherein the frequency of beam angle variation can be significantly faster than mechanical variation. For example, the ion implantation system 100 is configured to scan the ion beam 112 in the horizontal direction (e.g., along the first axis 123 or in the x-direction of FIG. 2) at approximately 1 kHz or 1000 times per second. The AEF 128 is further operable to bend entire scanned ion beam 112 in the vertical direction (e.g., bending the ion beam 112 along the second axis 129 of FIG. 3 or in the y-direction by approximately 15-20 degrees). For example, the scanned ion beam 112 can be oscillated back and forth at several hundred Hertz (e.g., sweeping the scanned ion beam at several hundred oscillations per second in the y-direction) via the AEF 128. If the workpiece 118 travels along the scan axis (shown as arrow 132 of FIG. 3) via the workpiece scanner 126 at a relatively slow scan speed, such as several centimeters per second, the angle variation in the top/center/bottom of the workpiece will be negligible, as a substantial amount of angular variation is achieved in a relatively short period of time while the workpiece is scanned by the workpiece scanner 126.

Thus, the present ion implantation system 100 of FIG. 2 varies the angle of implantation concurrently with implantation of ions, and as such, advantageously provides sidewall and trench implant profile control of three-dimensional structures, as well as increasing throughput over convention methodologies and systems. The AEF 128 thus adds small angle scanning capability to the system, such that during the implantation, the angle can be changed to have a more uniform angle spread at the surface of the workpiece 118.

Accordingly, the present disclosure utilizes the angular energy filter 128 for varying the angle of the implant during the implant. More broadly, the ion beam 112 is scanned vertically (e.g., in the y-direction) of a horizontally-scanned ion beam 112 (e.g., in the x-direction). As the ion beam 112 is quickly scanned in the x-direction (e.g., at approximately 1 kHz) via the beam scanner 122, it forms what appears to be a ribbon, even though the ion beam remains a spot beam when viewed instantaneously. As such, the whole scanned ion beam 112 (known also as a "ribbon beam") is further scanned vertically using the angular implant apparatus 130 as a scanning device. Thus, the angular implant apparatus 130 is not necessarily an angular energy filter as discussed above, but rather, the present disclosure contemplates any device operable to electrically and/or magnetically scan the ion beam 112 with respect to the workpiece 118 in both the first and second direction.

Figure 4:
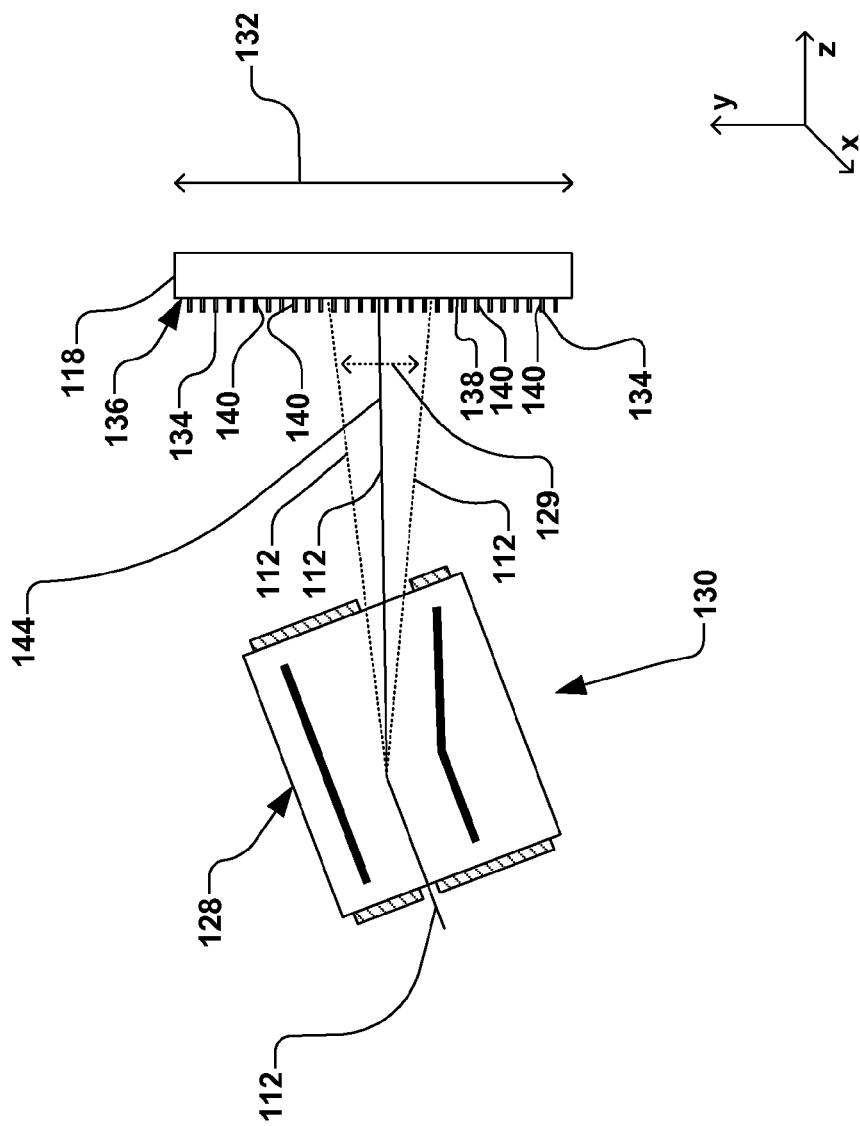
FIG. 4 illustrates an exemplary angular energy filter in accordance with various aspects of the disclosure.

FIGS. 3 and 4 illustrate the exemplary angular implant apparatus 130 comprising an AEF 128, wherein the scanned ion beam 112 (e.g., scanned in along the first axis 123 of FIG. 2 or x-direction) is further scanned (e.g., in along the second axis 129 or y-direction) utilizing the AEF 128. The workpiece 118, for example, is further scanned (e.g., mechanically) along the scan axis 132 in the y-direction via the workpiece scanner 126 of FIG. 2. As illustrated schematically in FIG. 4, for example, the workpiece 118 comprises a plurality of three-dimensional structures 134 formed or otherwise disposed thereon, such as FinFET structures (including any other layers or structures disposed thereon, such as photoresist, nitride, oxide, or the like), wherein the plurality of three-dimensional structures extend from a surface 136 of the workpiece. Accordingly, the angular implant apparatus 130 advantageously and expeditiously provides one or more different incident angle variations to adequately implant trenches 138 and/or sidewalls 140 of the structures 134 via scanning the ion beam 112 utilizing the AEF 128.

Figure 5:
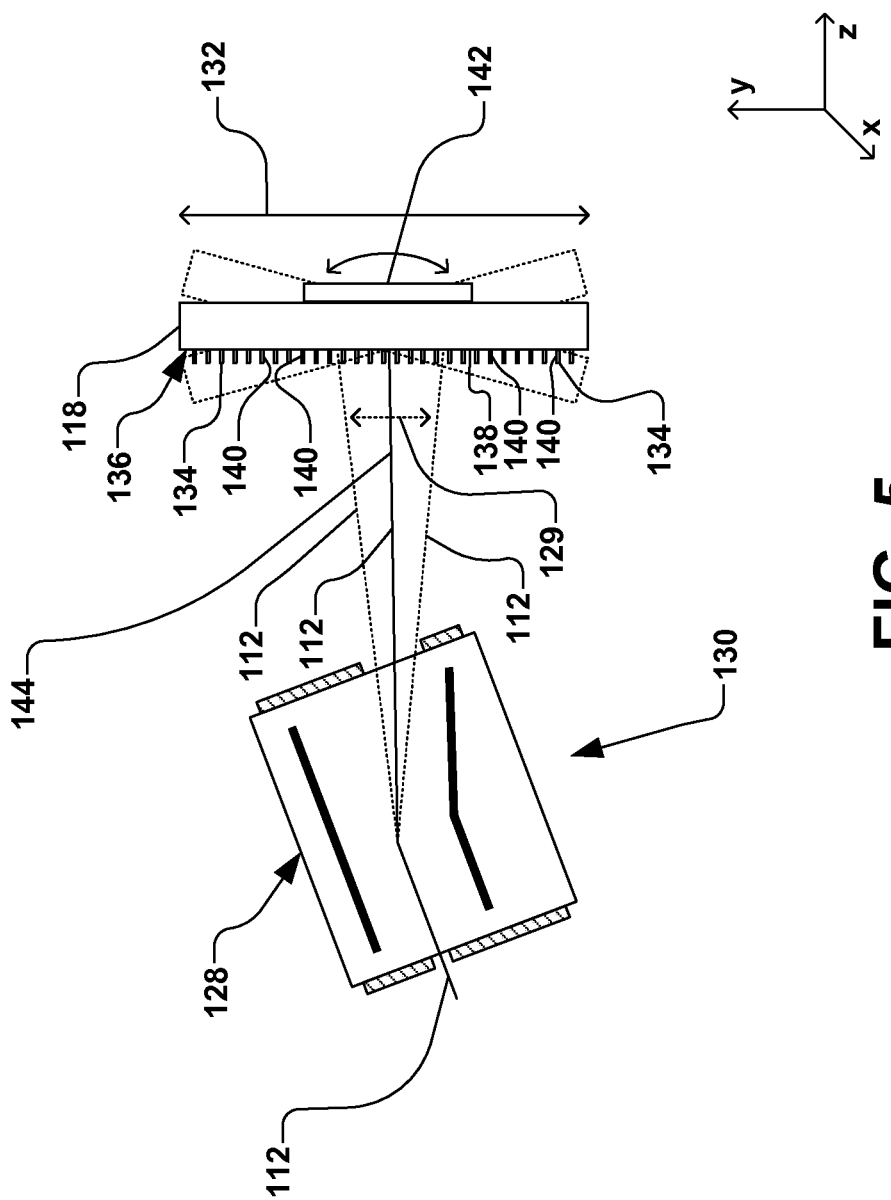
FIG. 5 illustrates another exemplary angular energy filter and mechanical scan in accordance with various aspects of the disclosure.

FIG. 5 illustrates another exemplary angular implant apparatus 130 comprising a mechanical apparatus 142, wherein the scanned ion beam 112 (e.g., scanned along the first axis 123 or x-direction of FIG. 2 by the beam scanner 122) is impacted to the workpiece 118, and wherein the workpiece is further mechanically tilted or scanned utilizing the workpiece support 120 of FIGS. 2 and 3. Again, the workpiece 118 of FIG. 5 is further scanned along the scan axis 132 in the y-direction via the workpiece scanner 126 of FIGS. 2 and 3. The mechanical apparatus 142, for example, is further operable to rotate (e.g., by 90 degrees or any amount) the workpiece 118 (and workpiece support 120 of FIGS. 2 and 3) about the z-axis, such that additional surfaces (not shown) of the structures 134 may be impacted by the ion beam 112. For example, if the layout of the three-dimensional structures 134 extend in various directions with respect to one another and with respect to the surface 136 of the workpiece 118, a rotation of ninety degrees or other desired rotation of the workpiece may be achieved by the mechanical apparatus 142.

A combination of the angular implant apparatus 130 of FIGS. 2-5, for example, can be utilized to advantageously provide both electrostatic/magnetic scanning and mechanical scanning/tilting of the workpiece 118 for implanting ions at one or more incident angles. Furthermore, a controller 150 illustrated in FIG. 2 is provided and operable to control some or all of the system 100, such as the AEF 128, angular implant apparatus 130, beam scanner 122, mechanical apparatus 142, and/or various other components of the ion implantation system based on the implantation desired.

The present disclosure, for example, thus provides the ability to deliver the ion beam 112 to opposing sides of the sidewall 140 of the three-dimensional structure 134 of FIG. 4 (e.g., a FinFET device) disposed on the workpiece 118. In an exemplary ion implantation, opposite sidewalls of such a three-dimensional structure are sequentially implanted at a workpiece tilt angle by rotating the workpiece (e.g., rotating about the so-called "twist angle") relative to a center axis of the workpiece. Such an implantation is often called a "bi-mode implant". Similarly, four different sidewalls of a three-dimensional structure are typically implanted by sequentially twisting the workpiece ninety degrees four times, in a so-called "quad implant". However, it has been found that deleterious effects to the line edge on one side of the device relative to the line edge on the other side of the device are presented in a bi-mode (0°/180°) implant, presumably due to a memory effect from the first implant scan to the second implant scan.

In accordance with the present disclosure, the ion beam 112 is advantageously scanned along the first axis 123 of FIG. 2 (e.g., scanned in the horizontal direction or x-direction via the beam scanner 122), and a parallel beam is formed by the parallelizer 124, whereby the parallelized beam is further scanned along the second axis 129 of FIGS. 2-5 (e.g., scanned in the vertical direction or y-direction). Accordingly, the ion beam 112 provided by the present disclosure is operable to implant opposing sidewalls 140 of the structure 134 during a single implant scan without the need to rotate the workpiece and perform separate implant scans, as performed conventionally. For example, an implant of the present disclosure can be particularly useful when the surface 136 of the workpiece 118 is perpendicular to a nominal centerline 144 the ion beam 112 with no tilt angle (e.g., a so-called "zero-degree implant"), wherein the ion beam is scanned using the AEF 128 as described above, such as a scan of +/− 10 degrees. Such a scanning of the ion beam 112 via the AEF, for example, advantageously implants both sides of the opposing sidewalls 140 in a single implant cycle. Further, using this approach for a square trench implant (e.g., bottom and side walls of the three-dimensional structure 138), a conventional "quad implant" can be advantageously reproduced by a single ninety-degree rotation of the workpiece 118 via the workpiece support 120 and utilizing the AEF 128 for scanning the ion beam 112, such that all four sides 140 of the three-dimensional structure 134 may be implanted without the need for four separate scan passes that are conventionally rotated ninety-degrees from one another.

Figure 6:
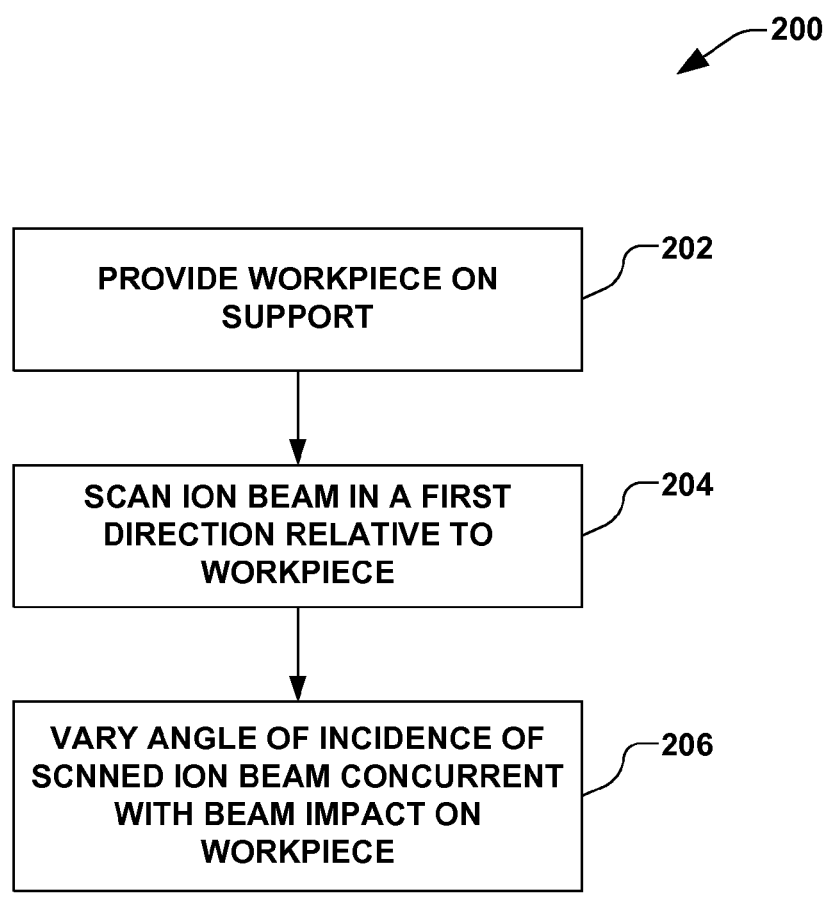
FIG. 6 is a block diagram illustrating an exemplary method for handling implanting ions into a workpiece according to various aspects of the disclosure.

In accordance with another exemplary aspect, a method 200 for implanting ions at multiple incident angles is illustrated in FIG. 6. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 200 comprises providing a workpiece on a workpiece support in act 202. In act 204, an ion beam is scanned relative to the workpiece. The workpiece support, for example, can comprise a movable workpiece support operable to translate and/or rotate the workpiece with respect to the ion beam. In act 206, an angle of incidence of the scanned ion beam is varied relative to the workpiece concurrent with the scanned ion beam impacting the workpiece. Varying the angle of incidence of the scanned ion beam relative to the workpiece in act 206, for example, comprises varying an input to an angular energy filter, therein varying the angle of incidence of the scanned ion beam relative to the workpiece concurrent with the scanned ion beam impacting the workpiece. The angular energy filter, for example, comprises one or more of a magnetic deflection module and an electrostatic deflection module. According to another example, varying the angle of incidence of the scanned ion beam relative to the workpiece further, or alternatively, comprises mechanically varying an angle of the workpiece support with respect to the scanned ion beam. Mechanically varying the angle of the workpiece support, for example, is performed concurrent with the scanned ion beam impacting the workpiece.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

What is claimed is:

1. An ion implantation system, comprising:
   an ion source configured to form an ion beam;
   a mass analyzer configured to mass analyze the ion beam;
   an ion beam scanner configured to scan the ion beam along a first axis, therein defining a scanned ion beam;
   a workpiece support configured to support a workpiece thereon;
   an angular implant apparatus, wherein the angular implant apparatus is configured to vary an angle of incidence of the scanned ion beam relative to the workpiece along a second axis; and
   a controller configured to control the angular implant apparatus, wherein the controller is configured to vary the angle of incidence of the scanned ion beam relative to the workpiece concurrent with the scanned ion beam impacting the workpiece, wherein the angular implant apparatus comprises an angular energy filter positioned downstream of the ion beam scanner, and wherein the controller is configured to vary an input to the angular energy filter, therein varying the angle of incidence of the scanned ion beam relative to the workpiece concurrent with the scanned ion beam impacting the workpiece.

2. The ion implantation system of claim 1, wherein the angular energy filter comprises one or more of a magnetic deflection module and an electrostatic deflection module.

3. The ion implantation system of claim 1, wherein the angular implant apparatus further comprises a mechanical apparatus operably coupled to the workpiece support, wherein the mechanical apparatus is further configured to further vary the angle of incidence of the scanned ion beam relative to the workpiece.

4. The ion implantation system of claim 3, wherein the controller is further configured to control the mechanical apparatus and angular energy filter.

5. The ion implantation system of claim 3, wherein the mechanical apparatus is configured to rotate the workpiece with respect to the ion beam.

6. The ion implantation system of claim 1, wherein the angular implant apparatus further comprises a mechanical apparatus operably coupled to the workpiece support, wherein the mechanical apparatus is further configured to further vary the angle of incidence of the scanned ion beam relative to the workpiece, and wherein the controller is further configured to control the mechanical apparatus concurrent with the scanned ion beam impacting the workpiece.

7. The ion implantation system of claim 1, further comprising a workpiece scanner configured to scan the workpiece relative to the ion beam.

8. A method for implanting ions into a workpiece at multiple incident angles, the method comprising:
   providing a workpiece on a workpiece support;
   scanning an ion beam relative to the workpiece; and
   varying an angle of incidence of the scanned ion beam relative to the workpiece via an angular implant apparatus concurrent with the scanned ion beam impacting the workpiece, wherein varying the angle of incidence of the scanned ion beam relative to the workpiece comprises varying an input to an angular energy filter, therein varying the angle of incidence of the scanned ion beam relative to the workpiece concurrent with the scanned ion beam impacting the workpiece.

9. The method of claim 8, wherein the angular energy filter comprises one or more of a magnetic deflection module and an electrostatic deflection module.

10. The method of claim 8, varying the angle of incidence of the scanned ion beam relative to the workpiece further comprises mechanically varying an angle of the workpiece support with respect to the scanned ion beam.

11. The method of claim 10, wherein mechanically varying the angle of the workpiece support is performed concurrent with the scanned ion beam impacting the workpiece.

12. An ion implantation system, comprising:
    an ion source configured to form an ion beam;
    a mass analyzer configured to mass analyze the ion beam;
    an ion beam scanner configured to scan the ion beam along a first axis, therein defining a scanned ion beam;
    a workpiece support configured to support a workpiece thereon;
    an angular energy filter, wherein the angular energy filter is configured to vary an angle of incidence of the scanned ion beam relative to the workpiece along a second axis; and
    a controller configured to control the angular energy filter, wherein the controller is configured to vary the angle of incidence of the scanned ion beam relative to the workpiece concurrent with the scanned ion beam impacting the workpiece.

13. The ion implantation system of claim 12, wherein the angular energy filter positioned downstream of the ion beam scanner, and wherein the controller is configured to vary an input to the angular energy filter, therein varying the angle of incidence of the scanned ion beam relative to the workpiece along the second axis concurrent with the scanned ion beam impacting the workpiece.

14. The ion implantation system of claim 13, wherein the angular energy filter comprises one or more of a magnetic deflection module and an electrostatic deflection module.

15. The ion implantation system of claim 12, wherein the workpiece support further comprises a mechanical apparatus operably coupled thereto, wherein the mechanical apparatus is configured to further vary the angle of incidence of the scanned ion beam relative to the workpiece, and wherein the controller is further configured to control the mechanical apparatus.

16. The ion implantation system of claim 15, wherein the mechanical apparatus is configured to rotate the workpiece with respect to the ion beam.

17. The ion implantation system of claim 16, wherein the controller is configured to evenly expose a plurality of sides of a three-dimensional structure disposed on a surface of the workpiece via a control of the angular energy filter and mechanical apparatus.

* * * * *